(12) United States Patent
Li et al.

(10) Patent No.: US 8,544,530 B2
(45) Date of Patent: Oct. 1, 2013

(54) HEAT DISSIPATION DEVICE AND METHOD FOR MANUFACTURING THE SAME

(75) Inventors: Wei Li, Shenzhen (CN); Yi-Qiang Wu, Shenzhen (CN); Chun-Chi Chen, Taipei Hsien (TW)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 1061 days.

(21) Appl. No.: 12/534,879

(22) Filed: Aug. 4, 2009

(65) Prior Publication Data

US 2010/0252239 A1 Oct. 7, 2010

(30) Foreign Application Priority Data

Apr. 1, 2009 (CN) .......................... 2009 1 0301273

(51) Int. Cl.
*F28F 1/32* (2006.01)
*H05K 7/20* (2006.01)

(52) U.S. Cl.
USPC .................... 165/80.2; 165/104.21

(58) Field of Classification Search
USPC ........ 165/80.2, 80.3, 104.21, 104.26, 104.33, 165/906; 29/890.03, 890.04, 890.046; 361/700, 710
See application file for complete search history.

(56) References Cited

U.S. PATENT DOCUMENTS

| | | | |
|---|---|---|---|
| 2004/0035558 A1* | 2/2004 | Todd et al. ................ | 165/104.26 |
| 2006/0048917 A1* | 3/2006 | Persson ............................ | 165/78 |
| 2007/0107883 A1 | 5/2007 | Chen | |

FOREIGN PATENT DOCUMENTS

CN  201122591 Y  9/2008

* cited by examiner

*Primary Examiner* — Teresa Walberg
(74) *Attorney, Agent, or Firm* — Altis & Wispro Law Group, Inc.

(57) ABSTRACT

A heat dissipation device includes a plurality of fins, a plurality of heat pipes connected to the fins in a thermal conductive relationship and a plurality of electric conductors extending through the fins. The fins are stacked together and spaced from each other. The heat pipes are extended through the fins. The electric conductors are electrically connected to the fins to enable consistent metal oxide films to be formed all over surfaces of the fins when anodizing the fins.

10 Claims, 5 Drawing Sheets

HEAT DISSIPATION DEVICE AND METHOD FOR MANUFACTURING THE SAME

BACKGROUND

1. Technical Field

The present disclosure relates generally to a heat dissipation device and, more particularly, to a heat dissipation device having a good electric conductivity for facilitating an anodizing processing on the heat dissipation device.

2. Description of Related Art

Heat dissipation devices are usually used to remove heat from heat-generating electronic components, such as central processing units (CPUs), power transistors, etc., to keep the components in stable operation.

Typically, the heat dissipation device is a parallel-fins heat sink, which is fabricated by processes including an extrusion process, a gang sawing process and a bonding process. It is known that thickness and number of the fins produced by the extrusion process is restricted by the structure limitation and stress loading limitation of a die. If the number of the fins increases, die fingers of the die become weaker thus easily break off. Therefore, the extrusion process is not suitable for fabricating the high-density-fins heat sink. The gang sawing process is performed by cutting off portions of a metal block to produce fins having predetermined thickness, number, depth and gap, which result in a great loss of material. In the bonding process, each fin is individually bonded into a base of the heat sink, which is time-consuming and labor intensive. In addiction, the fins that are not well-bonded into the base are likely to fall and thus be detached from the base.

A current thermal resolution to overcome the problems mentioned above is to provide a composite fin unit having a plurality of individual fins assembled together. The fins each have at least a flange extending perpendicularly from at least an edge thereof. Each flange of the fins is provided with a locking structure thereon. The locking structure of each fin engages with the locking structures of the rear and front fins to assemble the fins together. The fins usually would be processed by a surface treatment for corrosion protection or an aesthetic purpose. However, the fins assembled together by their locking structures can not be fully electrically connected with each other, thus they can not obtain an even, symmetrical color and lustre over their surfaces during an anodizing processing which is a popular surface treatments on fins of heat sinks.

What is needed, therefore, is a heat dissipation device which can overcome the above-mentioned disadvantages.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
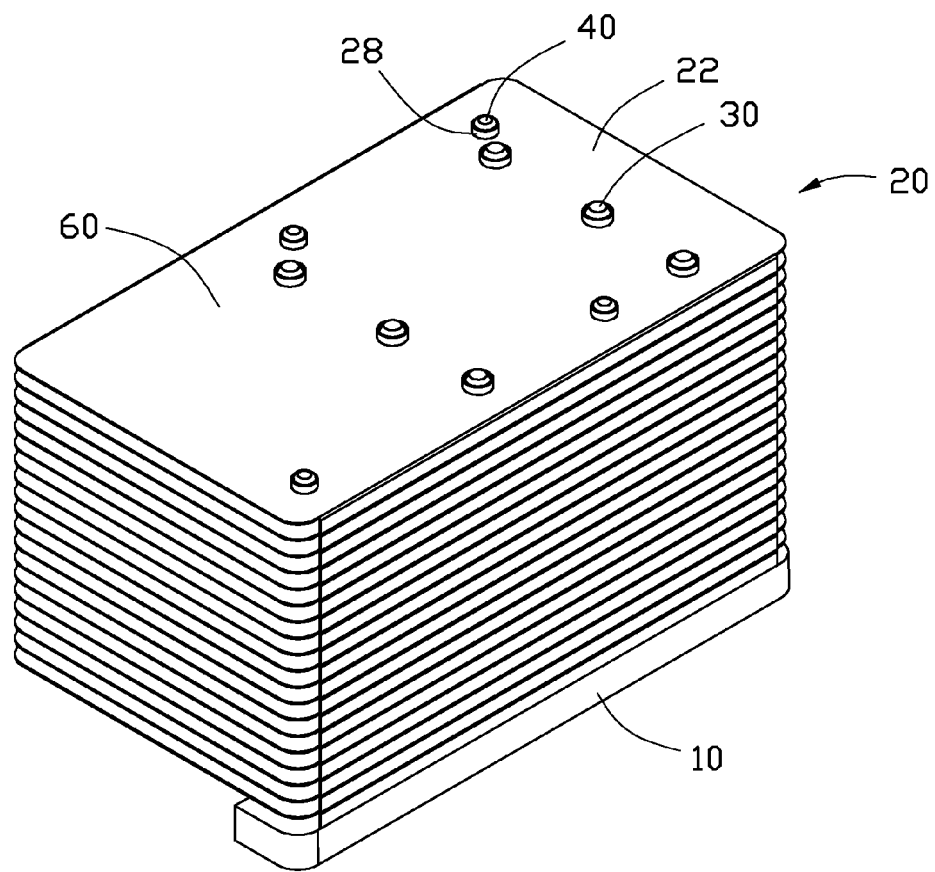
FIG. 1 is an isometric, assembled view of a heat dissipation device in accordance with an embodiment of the present disclosure.
Figure 2:
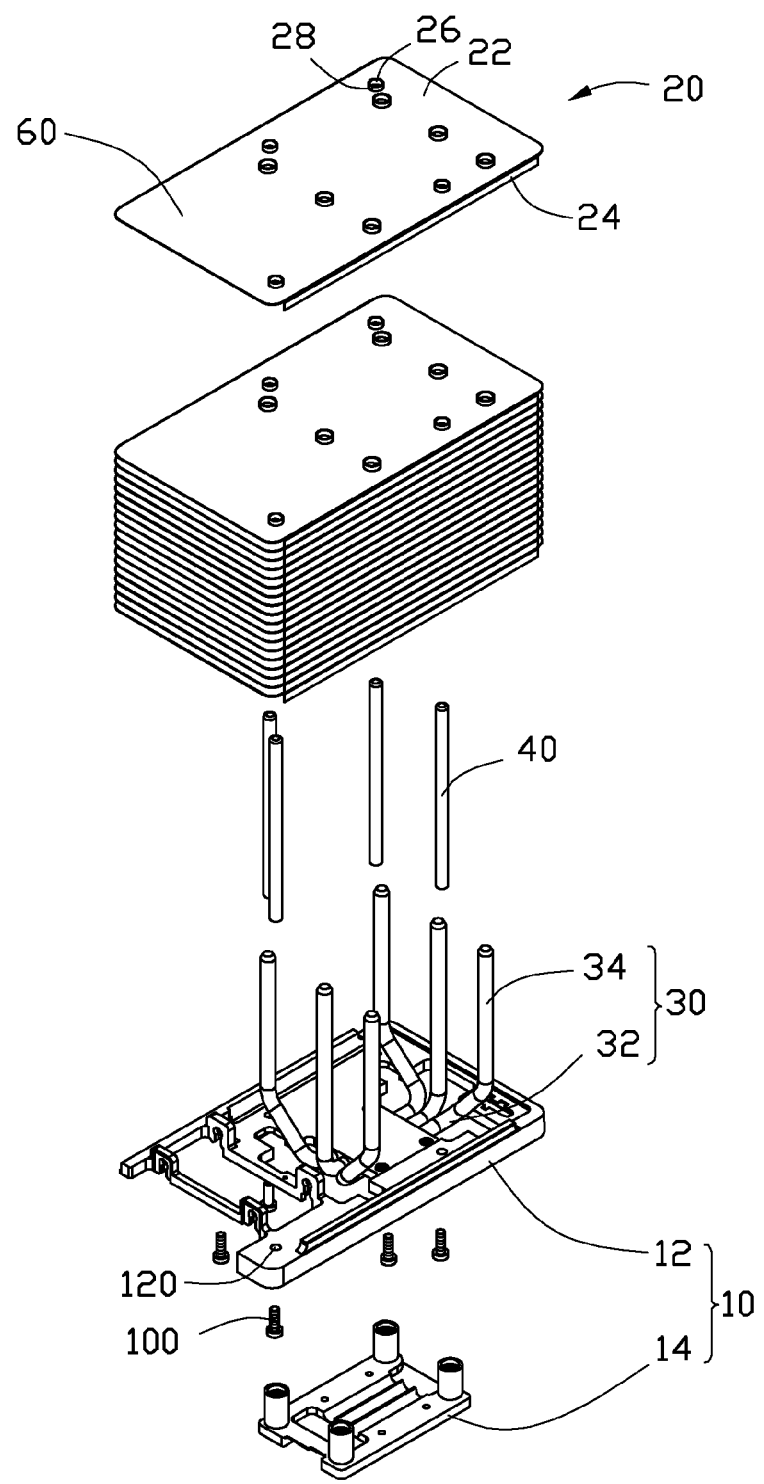
FIG. 2 is an exploded view of the heat dissipation device of FIG. 1.
Figure 3:
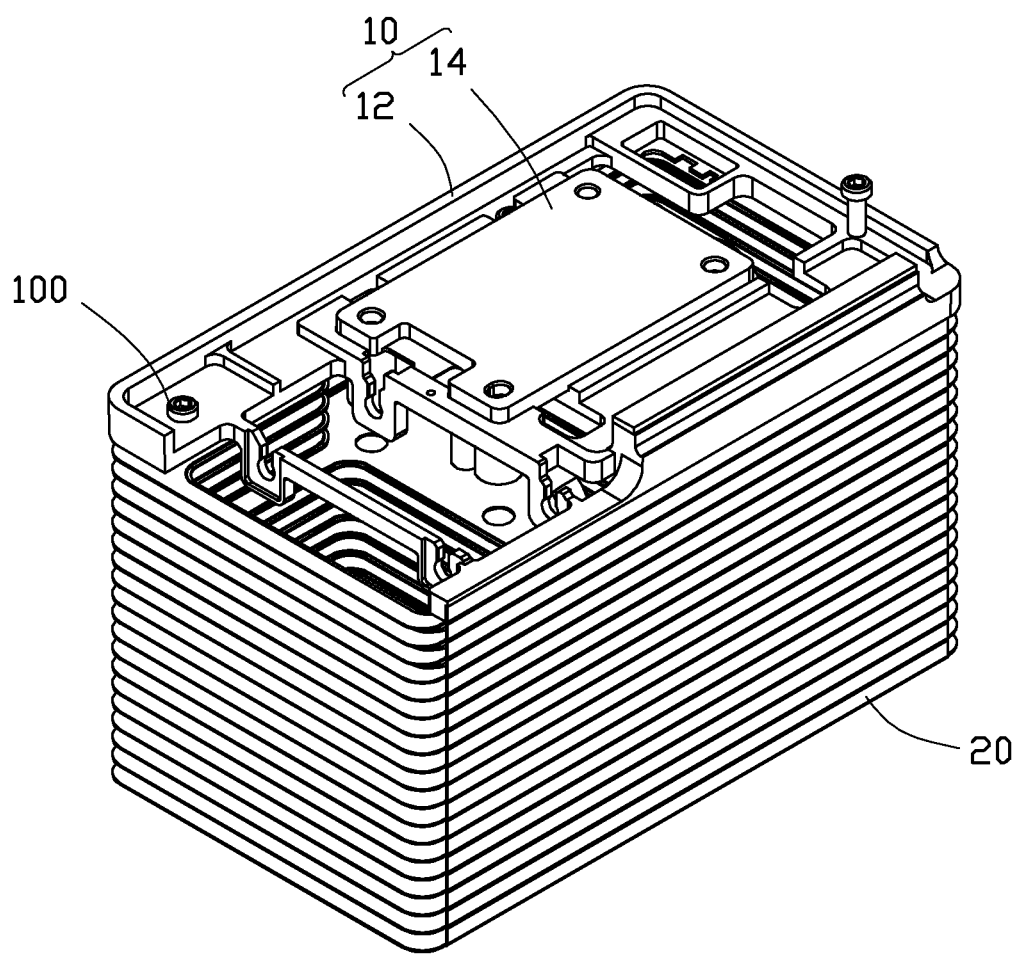
FIG. 3 is an inverted view of the heat dissipation device in FIG. 1.
Figure 4:
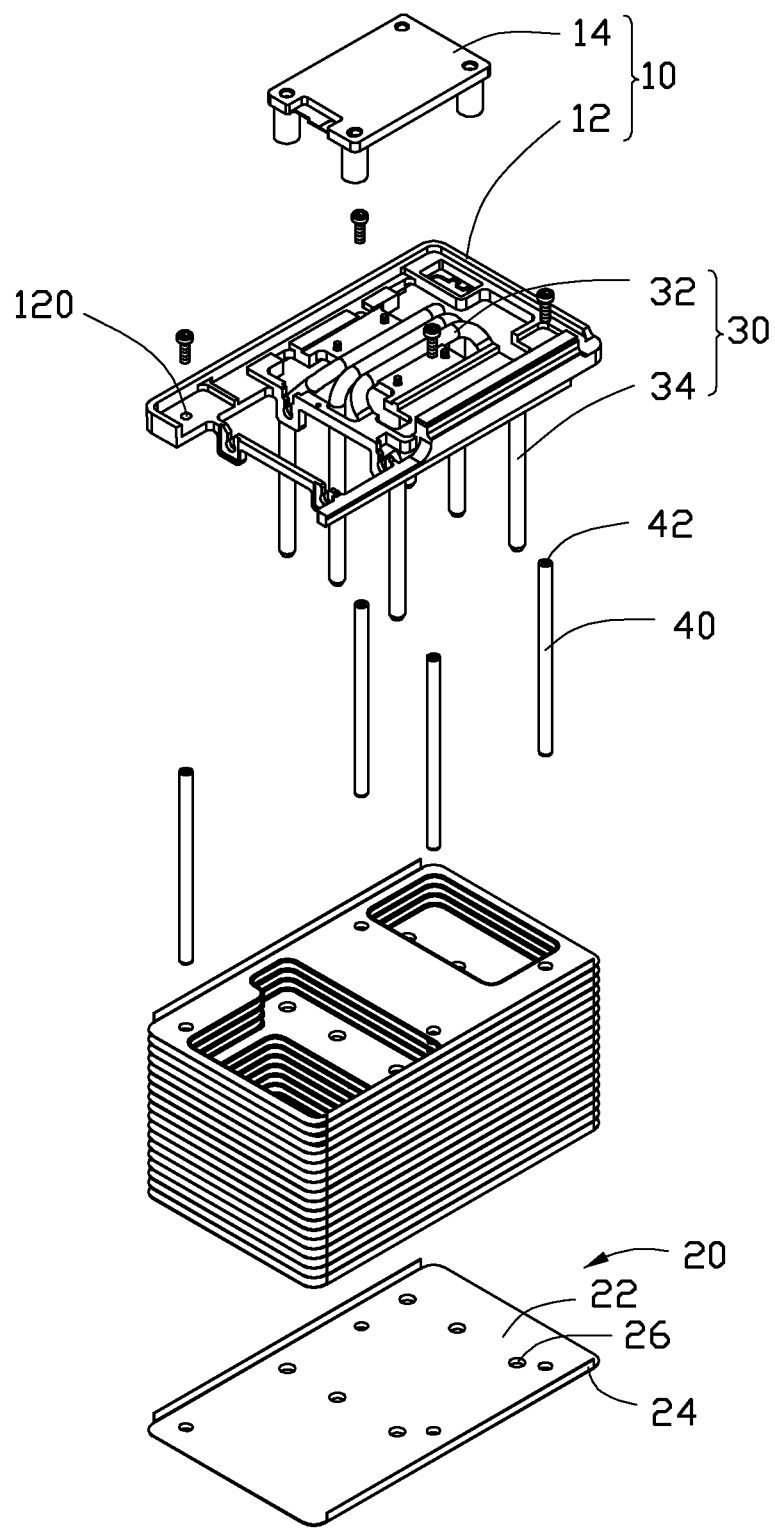
FIG. 4 is an exploded view of the heat dissipation device of FIG. 3.

FIGS. 1 and 2 illustrate a heat dissipation device in accordance with an embodiment of the present disclosure. The heat dissipation device is provided for removing heat from a heat-generating component such as an electronic component, more specifically a central processing unit (CPU) of a computer. The heat dissipation device comprises a base 10, a plurality of fins 20 on the base 10, a plurality of heat pipes 30 thermally connecting the base 10 and fins 20 together and a plurality of electric conductors 40 electrically connected to all of the fins 20.

The base 10 includes a frame 12 supporting the fins 20 thereon and a conducting plate 14 fixed to a bottom of the frame 12 for contacting the heat-generating component. The frame 12 has a rectangular configuration. A plurality of fixing holes 120 are defined in the frame 12, spaced from each other and adjacent to a periphery of the frame 12, for screws 100 extending therethrough to engage with the electric conductors 40. The conducting plate 14 is made of a material with good heat conductivity such as copper and has a flat bottom surface for contacting a top surface of the heat-generating component.

The fins 20 are made of aluminum with both good heat conductivity and electric conductivity, and are processed by anodizing to attain metal oxide films 60 all over the surfaces thereof for protecting the fins 20 from corrosion and obtaining an aesthetic appearance. Each fin 20 has a rectangular main body 22 and two flanges 24 extending downwardly and perpendicularly from two opposite long side edges of the main body 22. The fins 20 are horizontally stacked together with the main bodies 22 thereof parallel to a top surface of the frame 12 of the base 10. The fins 20 are spaced from each other by the flanges 24. The main body 22 has four round corners and a size similar to that of the frame 12 of the base 10.

A plurality of through holes 26 are defined in the main body 22 of each fin 20 for receiving the heat pipes 30 and the electric conductors 40. The through holes 26 for receiving the electric conductors 40 are respectively in alignment with the fixing holes 120 of the frame 12. A collar 28 extends perpendicularly and upwardly from each of the fins 20 at an edge of each through hole 26 of each of the fins 20 and intimately receives an electric conductor 40 or a heat pipe 30 therein for enlarging a contacting area between the fins 20 and the electric conductor 40 and the heat pipe 30. The through holes 26 of the fins 20 in a vertical line and the corresponding collars 28 around the corresponding through holes 26 cooperatively form a receiving tube perpendicular to the main bodies 22, which receives the electric conductor 40 or the heat pipe 30 therein.

The heat pipes 30 each are substantially U-shaped and each comprise an evaporating section 32 and two condensing sections 34 perpendicular to the evaporating section 32, and two curved sections (not labeled) respectively extending from two opposite ends of the evaporating section 32 and connecting the evaporating section 32 and the two condensing sections 34. The evaporating sections 32 of the heat pipes 30 are sandwiched between a central portion of the frame 12 and the conducting plate 14 and arranged closely side by side. The condensing sections 34 are extended upwardly from the frame 12 at locations corresponding two opposite lateral sides of the conducting plate 14 and through the fins 20. The condensing sections 34 are spaced from and parallel to each other. The condensing sections 34 are respectively received intimately in the corresponding tubes formed by the through holes 26 and collars 28 of the fins 20 and perpendicular to the fins 20.

The electric conductors 40 are made of aluminum with both good heat conductivity and electric conductivity. Each electric conductor 40 has a shape of an elongated post. The electric conductors 40 each extend through the fins 20 and are respectively received in the corresponding tube formed by the through holes 26 and collars 28 of the fins 28, whereby the electric conductors 40 each are in an intimate contact with each of the fins 20. A bottom end of each conductor 40 is rested on a top surface of the frame 12 and the base 10 and axially defines an engaging hole 42 therein, which communicates with the corresponding fixing hole 120 of the frame 12. The screws 100 are extended upwardly through the fixing holes 120 of the frame 12 and engagingly received in the corresponding engaging holes 42 of the conductor 40, whereby the electric conductors 40 are fixed on the frame 12. The electric conductors 40 are in an intimate and adequate contact with each of the fins 20; thus the fins 20 and the electric conductor 40 are electrically connected together.

Figure 5:
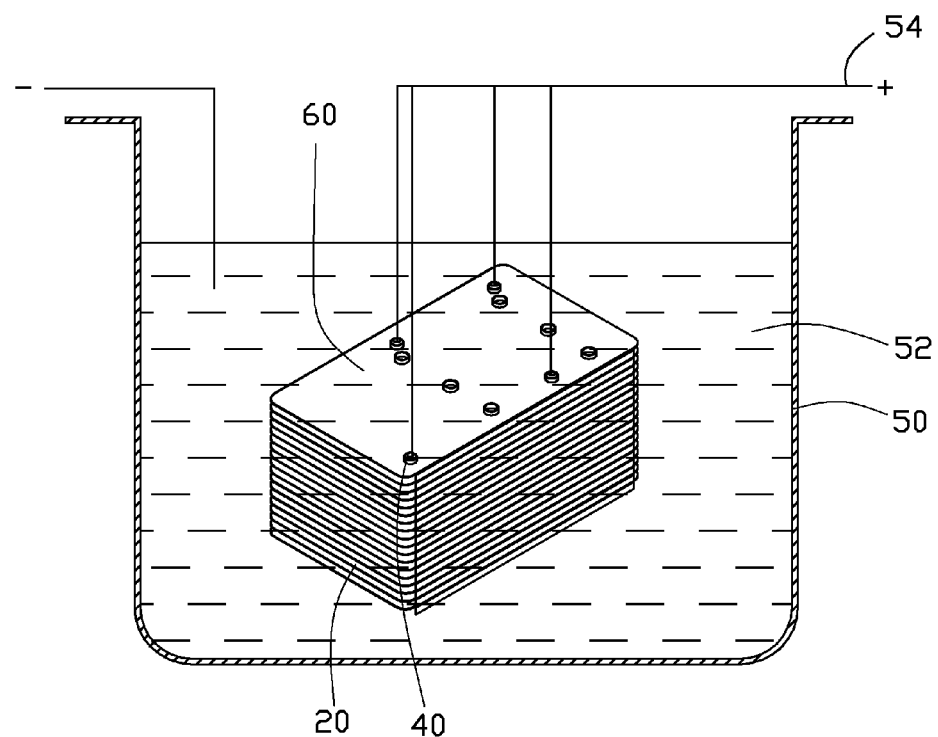
FIG. 5 is a schematic view showing fins of the heat dissipation device of FIG. 1 being processed by anodizing.

As shown in FIG. 5, during an anodizing processing, once the electric conductors 40 are electrically connected to an anode 54 of an electrolytic cell 50, conductance between each fin 20 and the anode 54 is equally good. Therefore, the fins 20 immersed in an electrolyte 52 of the electrolytic cell 50 can easily attain a consistent and expected metal oxide film 60 with a predetermined thickness all over their surfaces by the anodizing process.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
    a plurality of fins stacked together and spaced from each other;
    a plurality of heat pipes extending through the fins and connected to the fins in a thermal conductive relationship;
    a plurality of electric conductors extending through the fins and electrically connected to the fins; and
    consistent metal oxide films anodized on surfaces of the fins and the electric conductors.

2. The heat dissipation device as claimed in claim 1, wherein each of the electric conductors has a shape of an elongated post.

3. The heat dissipation device as claimed in claim 1, wherein the electric conductors are made of aluminum.

4. The heat dissipation device as claimed in claim 3, wherein the fins are made of aluminum and define therein a plurality of through holes receiving the electric conductors.

5. The heat dissipation device as claimed in claim 4, wherein a plurality of collars respectively project upwardly from the fins at edges of the through holes of the fins, the collars surrounding the electric conductors and in intimate contact with the electric conductors.

6. The heat dissipation device as claimed in claim 5, wherein the through holes of the fins are in a line and the collars around corresponding through holes in the line cooperatively form a receiving tube receiving one of the electric conductors therein.

7. The heat dissipation device as claimed in claim 1, wherein the fins each have two flanges extending perpendicularly from two opposite side edges thereof and by which the fins are spaced from each other.

8. The heat dissipation device as claimed in claim 1, further comprising a base comprising a frame on which the fins are placed and a conducting plate fixed to a bottom of the frame.

9. The heat dissipation device as claimed in claim 8, wherein each of the heat pipes has an evaporating section sandwiched between a central portion of the frame and the conducting plate and two condensing sections extending upwardly from two opposite ends of the evaporating section.

10. The heat dissipation device as claimed in claim 9, wherein the evaporating sections of the heat pipes are arranged side by side, and the condensing sections of the heat pipes extend upwardly from the frame and through the fins.

* * * * *